United States Patent [19]

Trueira

[11] Patent Number: 5,420,415
[45] Date of Patent: May 30, 1995

[54] STRUCTURE FOR ALIGNMENT OF AN ION SOURCE APERTURE WITH A PREDETERMINED ION BEAM PATH

[75] Inventor: Frank R. Trueira, York, Me.
[73] Assignee: Eaton Corporation, Cleveland, Ohio
[21] Appl. No.: 267,437
[22] Filed: Jun. 29, 1994
[51] Int. Cl.$^6$ ............................................. H01J 37/00
[52] U.S. Cl. ........................... 250/492.21; 250/423 R; 250/396 R
[58] Field of Search ............. 250/492.2, 492.21, 492.1, 250/491.1, 492.3, 423 R, 396 R, 398; 315/111.81, 111.31

[56] References Cited

U.S. PATENT DOCUMENTS

| | | | |
|---|---|---|---|
| 3,723,785 | 3/1973 | Nixon et al. | 250/396 |
| 4,580,058 | 4/1986 | Mears et al. | 250/396 R |
| 4,714,834 | 12/1987 | Shubaly | 250/427 |
| 4,847,504 | 7/1989 | Aitken | 250/423 R |
| 4,883,968 | 11/1989 | Hipple et al. | 250/423 R |
| 4,985,634 | 1/1991 | Seengl et al. | 250/492.21 |
| 5,300,785 | 4/1994 | Aitken | 250/423 R |

Primary Examiner—Jack I. Berman
Assistant Examiner—James Beyer
Attorney, Agent, or Firm—Watts, Hoffmann, Fisher & Heinke Co.

[57] ABSTRACT

A structure and method of accurately positioning and aligning an extraction member aperture (arc slit) and an extraction electrode gap with a predetermined beam line in an ion implantation apparatus is disclosed. The extraction member aperture is positioned with respect the ion beam source housing thereby eliminating cumulative tolerance errors which plague prior art ion implantation apparatuses. A removable alignment fixture is used in conjunction with a self-centering clamping assembly to accurately position the extraction member aperture in alignment with the predetermined beam line. The extraction member is secured to a support ring of the clamping assembly and the clamping assembly is mounted to the alignment fixture. The alignment fixture is mounted to the source housing precisely aligning the extraction member aperture with the predetermined beam line. The split ring of the clamping assembly is secured to a support tube surrounding the ion generating arc chamber. Since the clamping assembly is self centering, the alignment of the extraction member aperture is not compromised. The alignment fixture is then removed. After removal of the alignment fixture, a variable gap extraction electrode assembly is secured to the source housing. A machining fixture is used during fabrication and assembly of the extraction electrode assembly to insure that the electrode gap is aligned with the predetermined beam line when the extraction electrode assembly is mounted to the source housing.

18 Claims, 11 Drawing Sheets

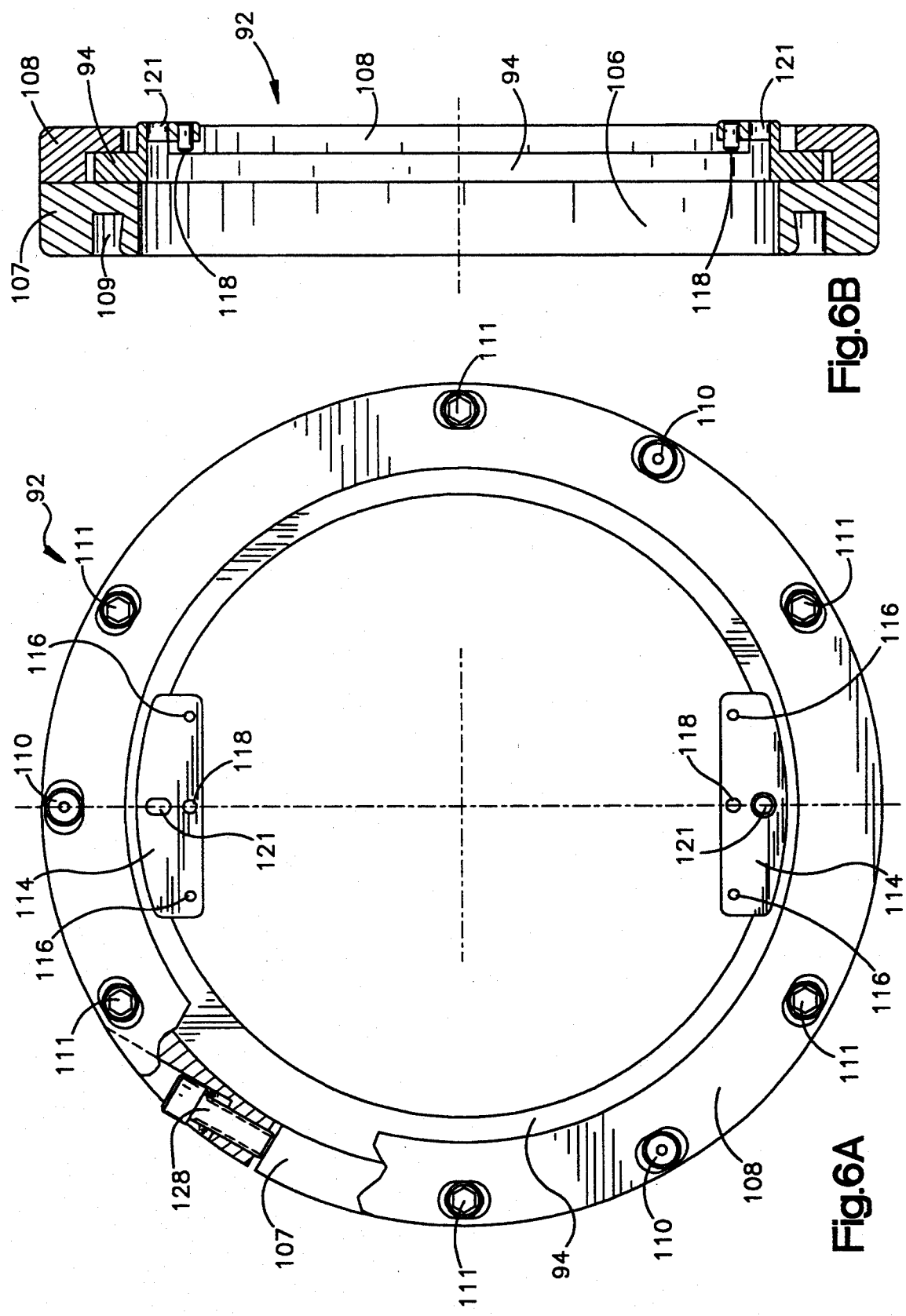

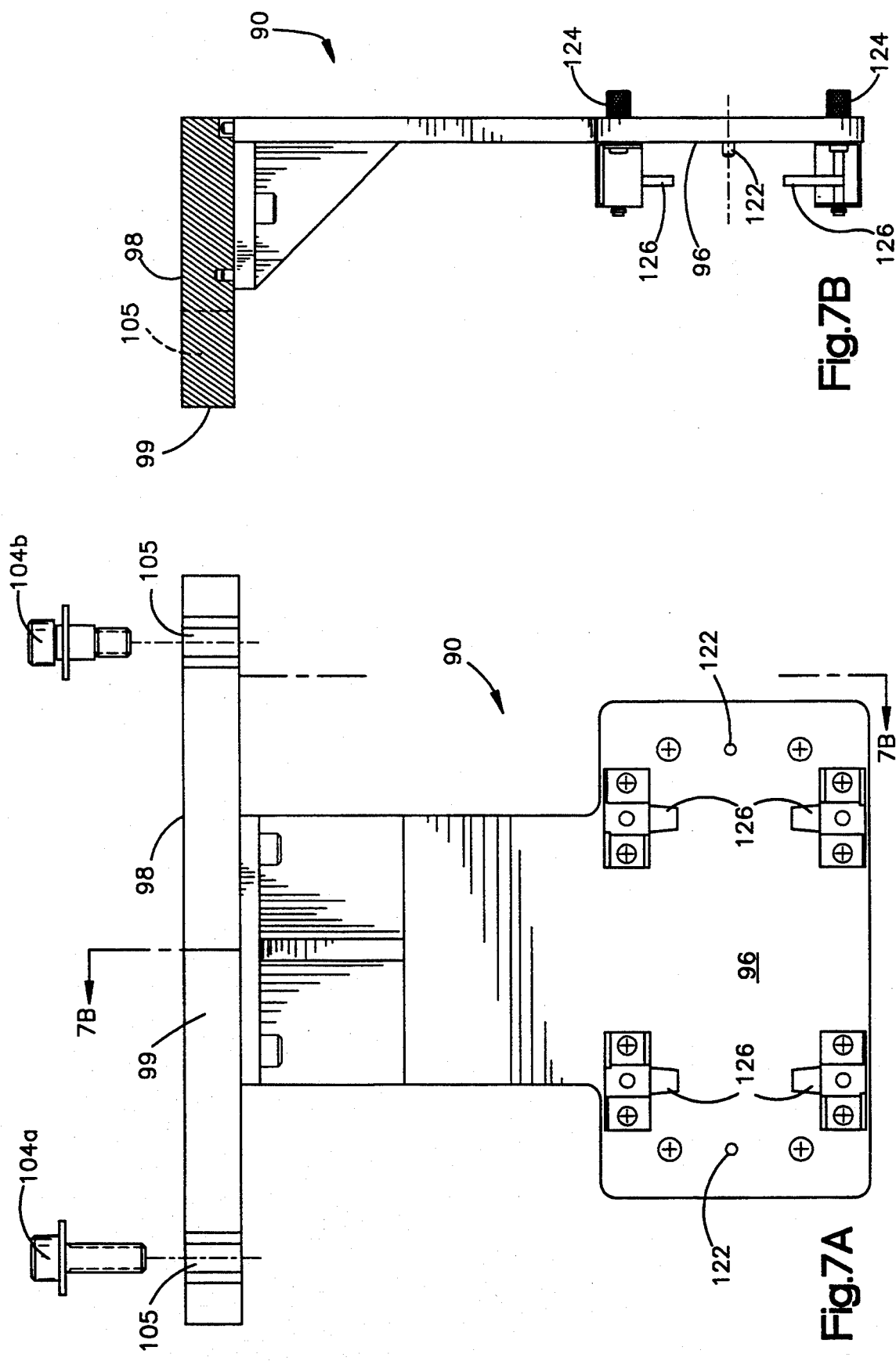

STRUCTURE FOR ALIGNMENT OF AN ION SOURCE APERTURE WITH A PREDETERMINED ION BEAM PATH

TECHNICAL FIELD

The present invention relates to an ion implantation apparatus used in ion beam treatment of a workpiece at an implantation station and, more specifically, to a structure and method of accurately positioning and aligning an extraction member aperture (arc slit) and an extraction electrode gap with a predetermined beam path.

BACKGROUND ART

One prior art technique for introducing dopants into a semiconductor wafer is to direct an ion beam along a beam travel path and selectively position silicon wafers to intercept the ion beam. This technique has been used in ion implanters to dope the wafer with controlled concentrations of the ion material.

One example of a commercial ion implantation apparatus is the Eaton NV 200 Oxygen Implanter. This prior art ion implanter utilizes an oxygen ion source having a cathode that includes a filament for providing electrons for ionizing oxygen molecules. Electrons emitted by the cathode are accelerated through a region containing oxygen gas in controlled concentrations. The electrons interact with the gas molecules, yielding energy to and ionizing the molecules. Once ionized, the charged oxygen molecules are accelerated along a path of travel thereby forming an ion beam for semiconductor wafer implantation. An ion source utilizing a cathode filament is disclosed in U.S. Pat. No. 4,714,834 which issued in the name of Shubaly.

Alternate proposals for ion source construction include the use of a microwave ion source that does not require a cathode or cathode filament. A microwave-powered ion source excites free electrons within an ionization chamber at a cyclotron resonance frequency. Collision of these electrons with gas molecules ionizes those molecules to provide ions and more free electrons within the chamber. These ions are then subjected to an accelerating electric field and exit the chamber in the form of an ion beam. U.S. Pat. No. 4,883,968 to Hipple et al. discloses one such resonance ion source. The disclosure of the '968 patent to Hipple et al. is incorporated herein in its entirety by reference.

A key element in the performance of an ion implantation apparatus is how accurately the generated ion beam path corresponds to a desired predetermined beam travel path. Ions generated in the ionization or arc chamber exit the chamber through an elongated aperture or arc slit. The ions are accelerated along a beam path by an electric field generated by an energized extraction electrode located near the arc chamber. The extraction electrode is comprised of two semicircular disk halves which are spaced apart forming an elongated gap through which the ions travel.

The position and alignment of the arc slit and the extraction electrode gap is critical to achieving a beam path that coincides with the predetermined beam path. Both the arc slit and the extraction electrode gap must be positioned so as to be axially aligned with the predetermined beam path. In prior art ion implantation devices, accurate alignment of the arc slit with respect to the predetermined beam path was difficult because of cumulative positioning tolerances between the arc slit and an ion beam source housing.

The source housing supports the components associated with generating the ion beam. In prior art devices, the arc slit is formed in an extraction member or plate which is mounted to the arc chamber. The arc chamber is supported by an ion source assembly. The ion source assembly is mounted within an ion source assembly support tube. The support tube is secured to an insulator. The insulator is coupled to the ion beam source housing. The cumulative tolerances associated with positioning the arc slit with respect to the ion beam source housing render the proper alignment of the arc slit with the predetermined beam path a difficult, costly and time consuming task. Furthermore, since the electrode plates are mounted on structure which is attached to and extends from to the ion beam source housing, accurate alignment of the arc slit and the extraction electrode gap was also difficult.

The present invention concerns a method and apparatus which overcomes the difficulties in positioning and aligning the arc slit and the extraction electrode gap with each other and the predetermined beam path.

DISCLOSURE OF THE INVENTION

Ion implantation apparatus constructed in accordance with a preferred embodiment of the invention includes an ion beam source housing and an ion source assembly. A portion of the ion source assembly extends into the source housing and is surrounded and supported by an ion source assembly support tube. The ion source assembly includes an open-sided arc chamber. The arc chamber defines a chamber interior into which an ionizable gas is routed. An open side of the arc chamber is closed by an extraction member or plate that includes an elongated aperture or arc slit through which ions exit the arc chamber. An energy source is provided for ionizing the gas in the chamber.

The ion implantation apparatus includes a self-centering clamping assembly. The extraction member is secured to a support ring of the clamping assembly. The support ring is disposed between a split ring clamp and a retainer ring and, initially, can move laterally with respect to the split ring clamp & retainer ring. The extraction member (with the clamping assembly attached thereto) is secured to a mounting face of the alignment fixture. The clamping assembly is removably mounted to a face of an alignment fixture. The alignment fixture, when mounted on the ion source housing, aligns the extraction member arc slit with a predetermined beam line and positions the clamping assembly such that the split ring clamp overlies one end of the ion source assembly support tube. The split ring clamp is clamped to the ion source assembly support tube. Because the clamping assembly is self-centering and there is lateral "play," between the support ring and the split ring clamp, the axial alignment of the arc slit with the predetermined beam path is maintained even if the support tube is off-center with respect to the predetermined beam line. The alignment fixture is then removed from the ion beam source housing.

By employing the alignment fixture, which positions the extraction member arc slit with respect to the ion beam source assembly housing, the cumulative positioning tolerance errors of prior art ion implantation apparatuses is eliminated. The alignment fixture permits precise positioning of the arc slit along the axis of the predetermined beam path. The self-centering clamping assembly permits the alignment fixture to be removed after proper alignment of the aperture with the predetermined ion beam has been achieved.

According to another aspect of the present invention, the extraction member includes flat front and back sides. The open-side of the arc chamber includes a peripheral wall engaging surface which is spring-loaded against the back side of the extraction member to provide sealing engagement between the are chamber and the extraction member. Instead of mounting the extraction member to the are chamber, the extraction member is precisely positioned in axial alignment with the predetermined ion beam path using the alignment fixture and is secured to the ion source assembly support tube using the clamping assembly. This arrangement accommodates slight deviations in the position of the are chamber within the ion source assembly support tube while maintaining axial alignment of the generated ion beam with the predetermined ion beam path.

According to yet another aspect of the invention, the apparatus further includes an ion accelerating electrode assembly including an extraction electrode comprised of two spaced apart disk halves. The disk halves are supported so as to be spaced apart thereby defining an extraction electrode gap through which the ions pass as they are accelerated along the beam path. The extraction electrode gap is aligned with the extraction member arc slit.

The disk halves are secured to first and second support legs, respectively. Each support is mounted on a respective angled track. The tracks are parallel with the predetermined beam path and are angled in opposite directions. A motor is provided to move the supports in unison along their respective angled tracks. As the supports are moved in unison along their respective tracks, the width of the extraction electrode gap varies thereby providing for the adjustment of the ion beam.

These and other objects, advantages and features of the invention will become better understood from a detailed description of a preferred embodiment of the invention which is described in conjunction with the accompanying drawings.

BRIEF DESCRIPTION OF THE DRAWINGS

FIG. 6A is a front elevational view of a clamping assembly;

FIG. 6B is a sectional view of the clamping assembly of FIG. 6A;

FIG. 7A is a front elevational view of the alignment fixture shown in FIGS. 3 and 4;

FIG. 7B is a view, partly in elevation and partly in section, of the alignment fixture of FIG. 7A as viewed from cut line 7B—7B of FIG. 7A;

BEST MODE FOR CARRYING OUT THE INVENTION

Figure 1:
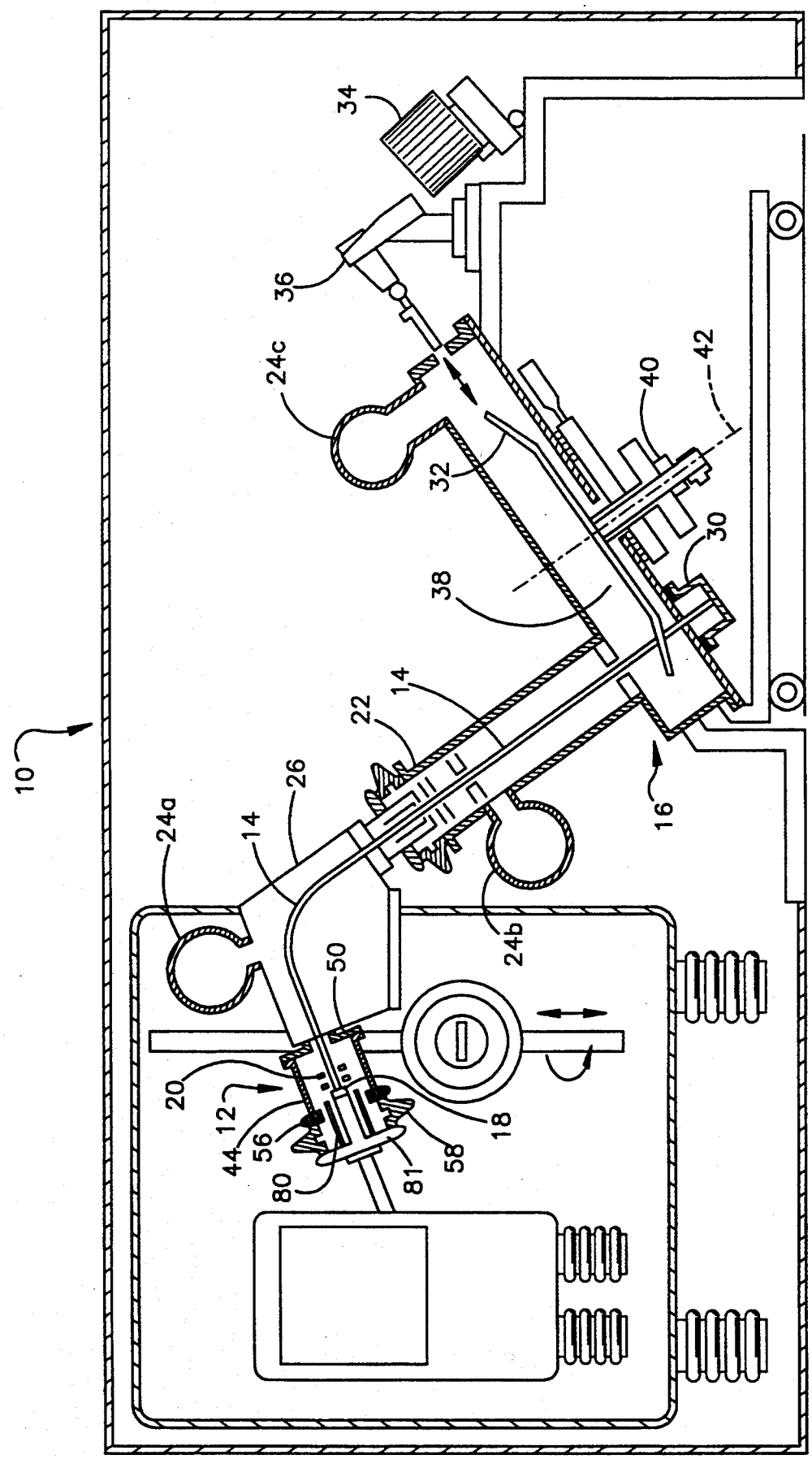
FIG. 1 is a schematic depiction of an ion implantation apparatus.

Turning now to the drawings, FIG. 1 is a schematic overview depicting an ion implantation apparatus 10 having an ion beam source assembly 12 that produces ions and accelerates the ions along a path to form an ion beam 14. Ions in the beam 14 traverse a path from the ion beam source assembly 12 to impinge on a workpiece (not shown) at an implantation station 16. At one typical implantation station, the ion beam 14 impacts silicon wafers (not shown) to selectively introduce ion particles which dope the silicon wafers and produce a semiconductor wafer.

In the ion implantation system 10 depicted in FIG. 1, the ion beam 14 traverses a fixed travel path. Control over ion implantation dose is maintained by selective movement of the silicon wafers through the ion beam 14. One example of a prior art implantation system 10 is the model NV-20A implanter sold commercially by Eaton Corporation. The ion beam source assembly 12 utilizes either a microwave generator or a filament to excite free electrons in the interior of an ion generation or arc chamber 18, shown in FIGS. 3, 4, 5A and 5B. The electrons collide with gas molecules injected into the arc chamber interior and ions are generated. The generated ions are accelerated from the arc chamber 18 and formed into an ion beam 14 by an extraction electrode 20, shown in FIGS. 3, 10A, 10B and 10C. Ions entering the implantation chamber 16 have an initial energy (40–50 kev, for example) provided by the extraction electrode 20.

The ion beam 14 travels through an evacuated path to the implantation station 16. The evacuated path is provided by vacuum pumps 24a, 24b, 24c shown in FIG. 1. The ions that make up the ion beam 14 enter an analyzing magnet 26 which bends the charged ions toward the implantation station 16. Ions having multiple charges and different species ions having the wrong atomic number are lost from the beam 14 due to ion interaction with the magnetic field set up by the analyzing magnet 26. Ions traversing the region between the analyzing magnet 26 and the implantation station 16 are accelerated to even higher energy by an accelerating electrode 22 before impacting wafers at the implantation station 16.

Control electronics (not shown) monitor the implantation dose reaching the implantation station 16 and increase or decrease the ion beam concentration based upon a desired doping level for the silicon wafers at the implantation station 16. Techniques for monitoring ion beam dose are known in the prior art and typically utilize a Faraday cup 30 which intersects the ion beam to monitor beam dose. The implantation station 16 includes a moveable support 32 for the wafers. During loading of the moveable support 32, wafers are withdrawn from a wafer cassette 34 by a robotic arm 36 and inserted through a load-lock (not shown) into an implantation chamber 38. The moveable support 32 is rotated by a motor 40 about a center axis 42 to cause wafers placed on an outer periphery of the moveable support 32 to pass through the ion beam 14.

Figure 2:
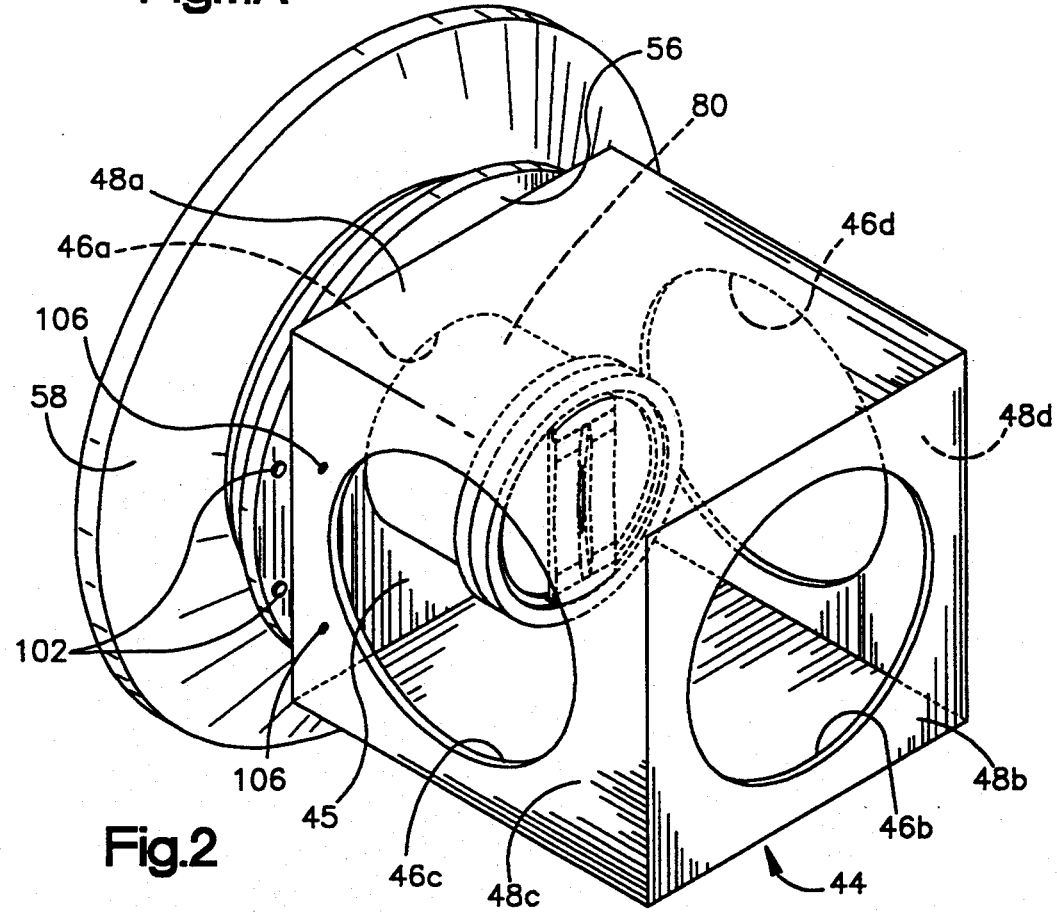
FIG. 2 is a schematic depiction of a portion of an ion beam source assembly including an ion beam source housing, an interface plate, an insulator and an ion source assembly support tube.
Figure 3:
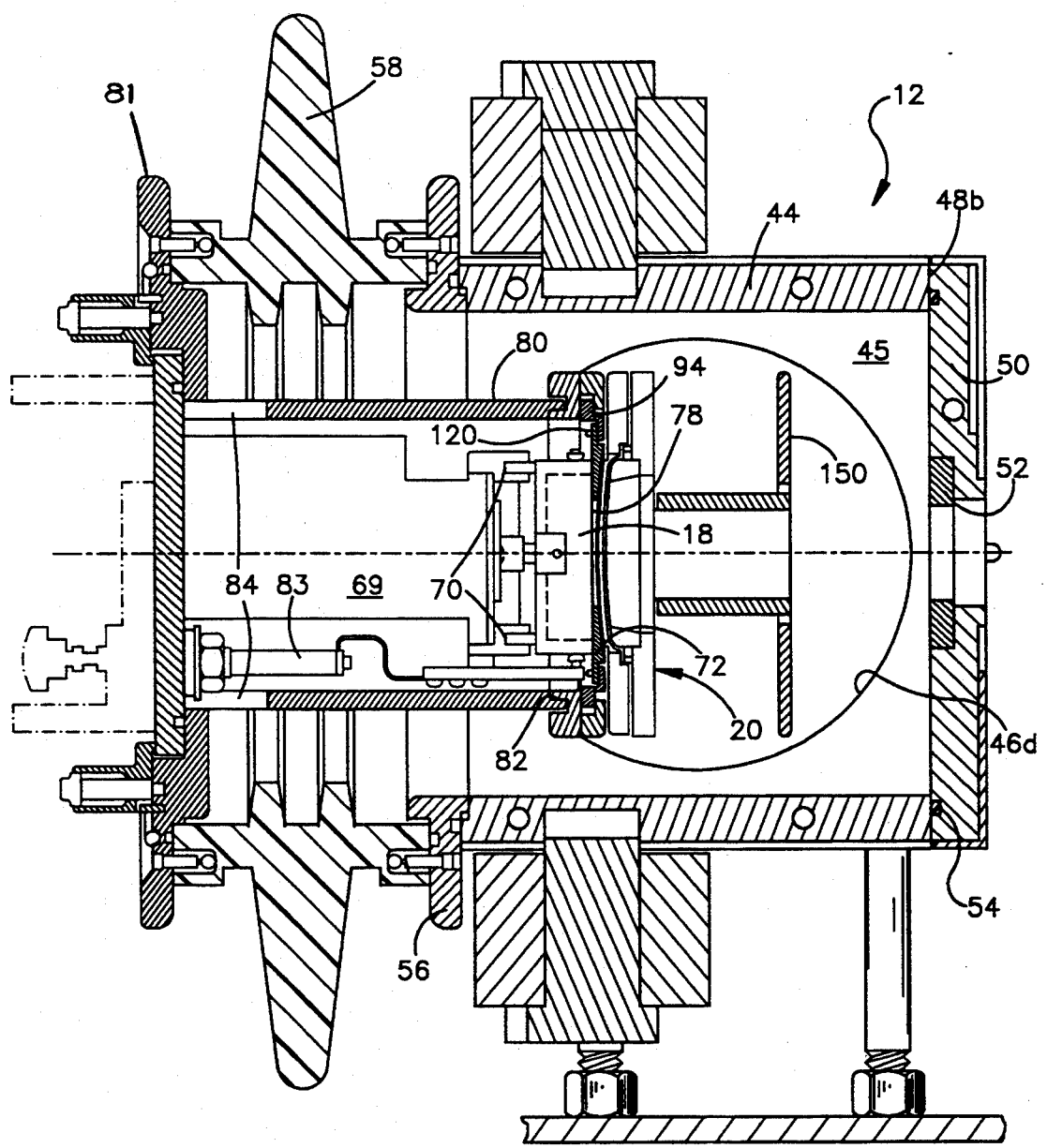
FIG. 3 is a sectional view of the a portion of an beam source assembly.

The ion beam source assembly 12 constructed in accordance with the present invention is depicted in greater detail in FIG. 2. The ion beam source assembly 12 includes a cube-shaped source housing 44. The source housing 44 is comprised of aluminum and has an interior cavity 45 with four access openings 46a, 46b, 46c, 46d in the housing vertical side walls 48a, 48b, 48c, 48d respectively in communication with the interior cavity 45. Turning to FIG. 3, a grounded beam line plate 50 is secured to vertical face 48b of the source housing 44. The grounded beam line plate 50 includes a slotted graphite insert 52 through which the ion beam 14 exits the ion beam source assembly 12 on its way to the analyzing magnet 26. An O-ring 54 disposed within an annular groove machined into the grounded beam line plate 50 maintains a vacuum tight engagement between the ion beam source housing 44 and the beam line plate 50. When the ion implantation apparatus 10 is in operation, a vacuum is maintained in the source housing interior cavity 45. The ion beam source housing 44 is in electrical contacts with the grounded beam line plate 50. As can be seen in FIGS. 2 and 3, an interface plate 56 is secured between the source housing vertical face 48a opposite the grounded beam line plate 50 and an insulator 58.

Turning to FIGS. 3, 4, 5A and 5B, the ions that form the beam 14 are generated in the arc chamber 18. The arc chamber 18 defines a chamber interior 60 and has an open side 62. The arc chamber includes a filament 64 and a repeller plate 66. Gas to be ionized is injected into the interior of the arc chamber 18 through a gas inlet aperture 68.

Figures 11A, 11B, 11C:
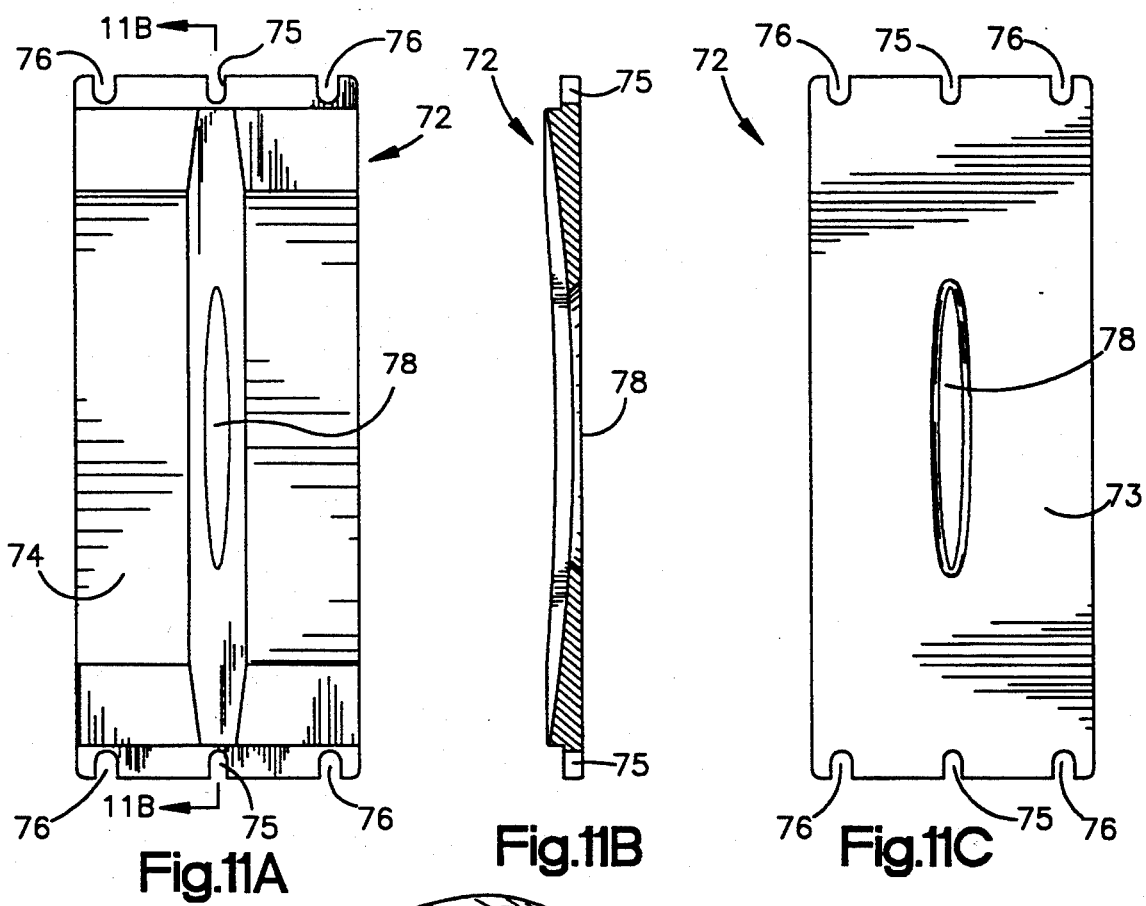
FIG. 11A is a front elevation view of an extraction member.
FIG. 11B is a sectional view of the extraction member of FIG. 11A as viewed from cut line 11B—11B of FIG. 11A.
FIG. 11C is a back elevational view of the extraction member of FIG. 11A.
Figure 4:
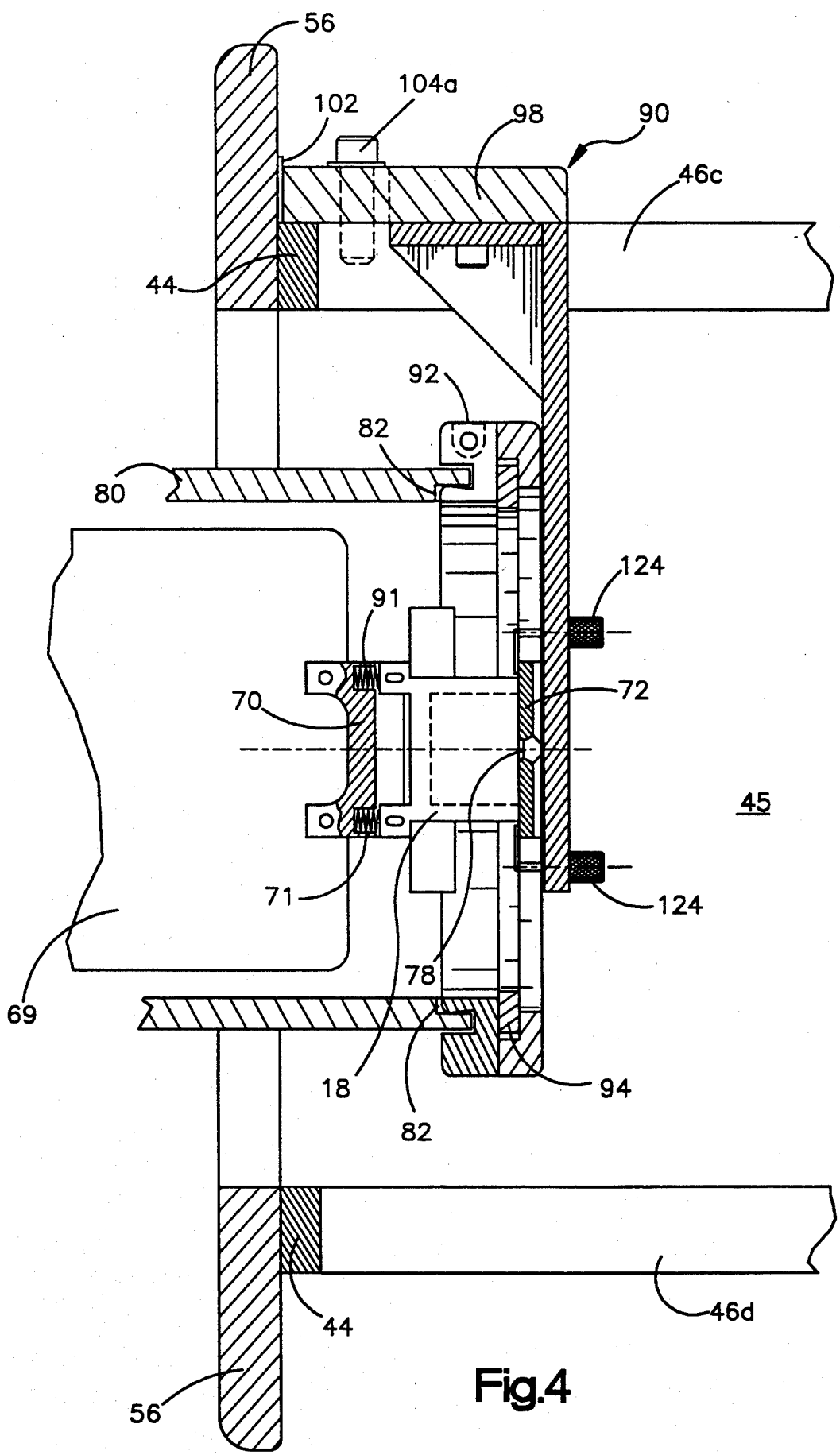
FIG. 4 is a view, partly in section and partly in elevation, of a portion of the source assembly housing and the ion source assembly support tube with an alignment fixture and clamping assembly mounted thereto.

As can best be seen in FIGS. 3 and 4, the arc chamber 18 is supported at one end of an ion source assembly 69 by an extension 70. A pair of springs 71 bias the arc chamber 18 against an extraction member 72. The extraction member 72 (FIGS. 11A, 11B and 11C) is rectangular in shape and flat on one side 73, which is the side the arc chamber 18 bears against. The opposite side 74 of the extraction member is concave or slightly inwardly bowed as can best be seen in FIG. 11B. The extraction member 72 includes two precision peripheral positioning slots 75 at opposite ends of the member and four additional peripheral slots 76, two each at opposite ends of the member. The precision peripheral positioning slots 75 are aligned with a central axis of an elongated elliptical aperture or arc slit 78 through which ions generated within the arc chamber 18 exit the chamber and are accelerated along the ion beam path by the extraction electrode 20. The extraction electrode 20 (FIGS. 3, 10A, 10B and 10C) is electrically energized and controllably biased with respect to an electrical potential of the arc chamber 18 to accelerate ions exiting through the extraction member arc slit 78 away from the arc chamber 18.

Figure 5A:
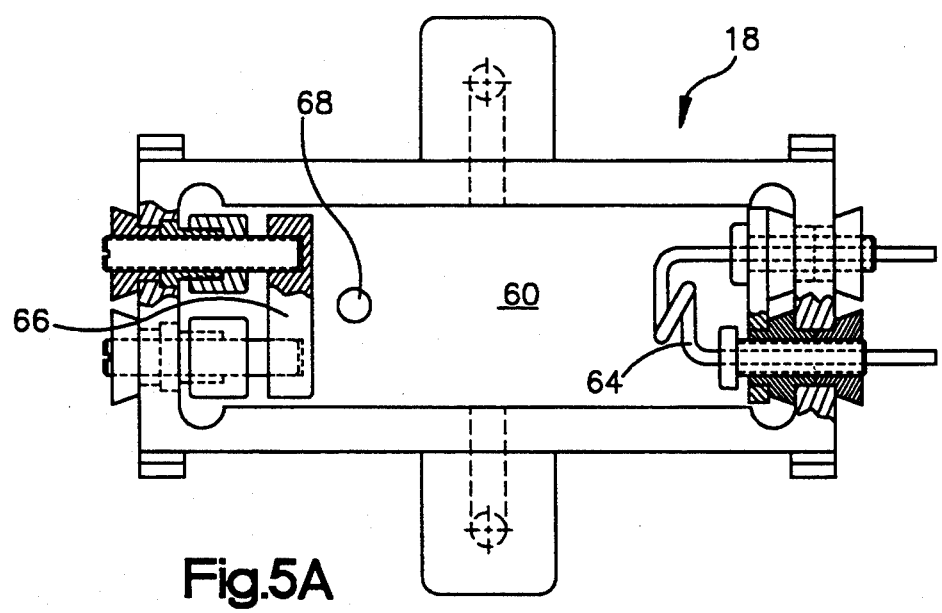
FIG. 5A is a view, partly in plan and partly in section, of an ion arc chamber.
Figure 5B:
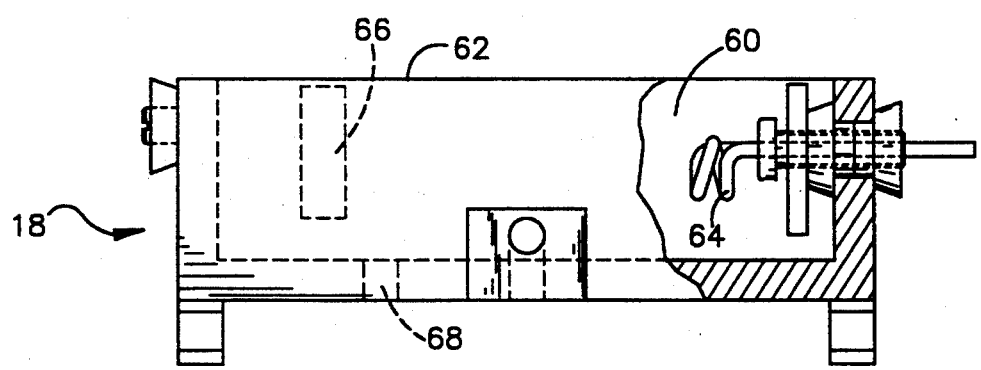
FIG. 5B is a view, partly in elevation and partly in section, of the arc chamber of FIG. 5A.

Turning to FIGS. 3 and 4, an ion source assembly support tube 80 surrounds and supports the ion source assembly 69. The support tube 80 is comprised of a conducting material such as aluminum and extends through the source housing access opening 46a. The support tube 80 is coaxial with the source housing access opening 46b and includes a flange 81 that abuts the insulator 58. Two cut-outs 84 in the support tube near the flange 81 provide clearance for a power feed 83 to the filament 64 (FIGS. 5A and 5B). An end of the support tube 80 spaced from the flange 81 surrounds the arc chamber 18 and includes an annular stepped portion 82 machined into the inner periphery of the support tube 80. As can be seen in FIG. 3, the flange 81 of the ion source assembly support tube 80 is coupled to and supported by the insulator 58. The insulator 58 isolates the ion beam source housing 44 from the positive energization voltages needed to generate and accelerate the ions away from the arc chamber 18.

To insure that the generated ion beam 14 follows the predetermined beam path, it is very important that the extraction member arc slit 78 and extraction electrode 20 be correctly aligned with respect to each other and precisely positioned with respect to the ion beam source housing 44. Failure to properly position the extraction member arc slit 78 or the extraction electrode 20 with respect to the ion beam source housing 44 will result in difficulties in making the ion beam path 14 to coincide with the predetermined, desired beam path and in controlling the ion dosage to treat wafers within the implantation station 16.

In the present invention, extraction member arc slit 78 is precisely positioned with respect to the ion beam source housing 44 utilizing an alignment fixture 90 removably mounted on the source housing 44 (FIG. 4) which precisely positions the extraction member 72 within the interior cavity 45 of the source housing 44 such that the arc slit 78 is in proper axial alignment with the predetermined beam path. The extraction member 72, which is mounted to a support ring 94 of a self-centering clamping assembly 92 (FIGS. 6A and 6B). The support ring 94 is movably supported by an outwardly opening split ring clamp 107 which is initially loosely coupled to a retainer ring 108. That is, in the clamping assembly's initial condition, the support ring 94 and extraction member 72 can slide or move laterally with respect to the loosely coupled split ring clamp 107 and retainer ring 108.

Figure 8A:
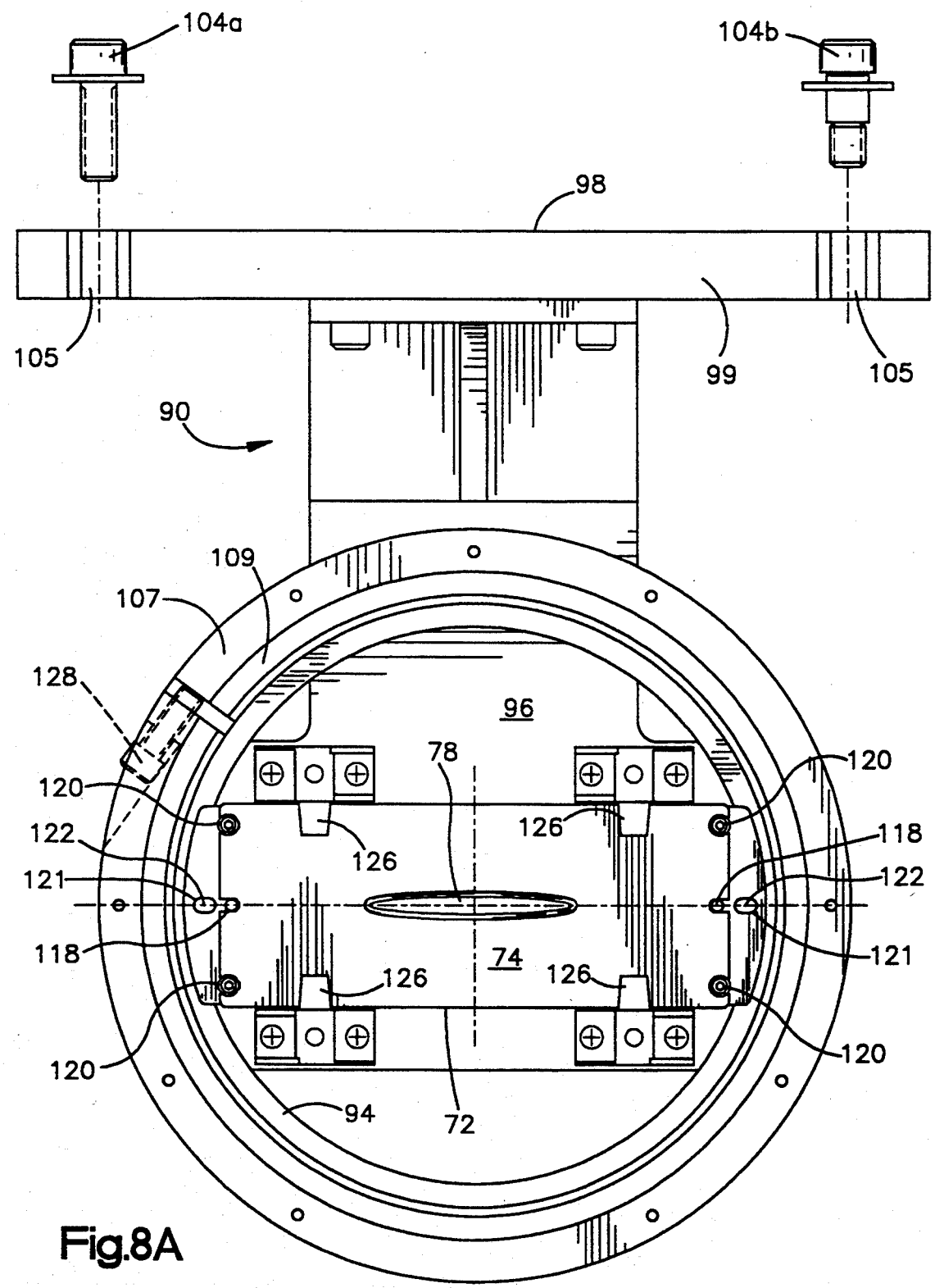
FIG. 8A is a front elevational view of the alignment fixture of FIG. 7A with the clamping assembly of 6A mounted thereto.
Figure 8B:
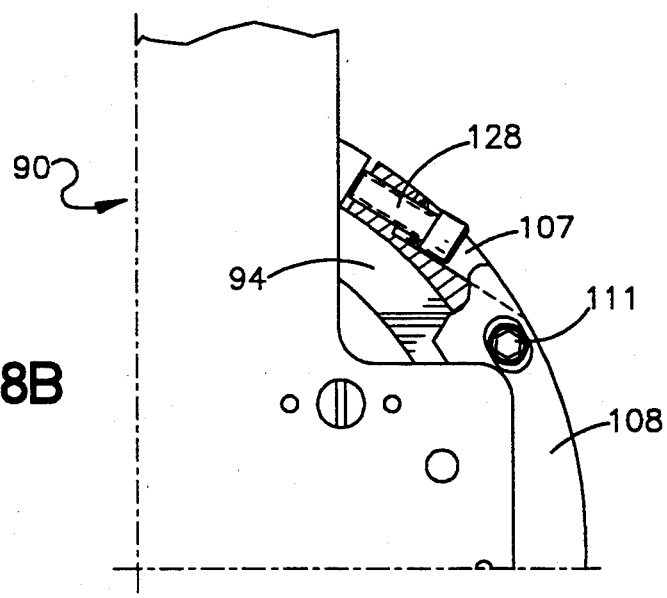
FIG. 8B is a back elevation view of a portion of the alignment fixture of FIG. 7A with the clamping assembly of FIG. 6A mounted thereto.

The extraction member 72 (with the clamping assembly 92 attached thereto) is mounted to the alignment fixture 90 (FIGS. 8A and 8B). When the alignment fixture 90 is mounted on the source housing 44, the split ring clamp 107 is secured to the end of the ion source assembly support tube 80. Because the extraction member 72 remains secured to the alignment fixture and because the support ring 94 and extraction member 72 can move laterally with respect to the split ring clamp 107, the extraction member 72 remains aligned with the predetermined ion beam path while the split ring clamp 107 is secured to the support tube 80. After the split ring clamp 107 has been secured to the support tube 80, the retainer ring 108 is tightly coupled to the split ring clamp 107 securing the support ring 94 and extraction member 72 in place. The alignment fixture 90 is then released from the extraction member 72 and removed from the ion source housing 44. Positioning the arc slit 78 directly with respect to the ion beam source housing 44 eliminates the cumulative tolerance errors of prior art ion implantation devices.

The alignment fixture 90, shown in FIGS. 4, 7A, 7B, 8A and 8B is used in conjunction with the self-centering clamping assembly 92, shown in FIGS. 3, 4, 6A 6B, 8A and 8B. The extraction member 72 is secured to a support ring 94 of the clamping assembly 92. The extraction member 72 (with the clamping assembly 92 attached thereto) is then mounted to a front mounting surface 96 of the alignment fixture 90.

As can be seen in FIG. 4, the alignment fixture 90 includes a mounting flange 98 which is secured to the vertical face 48c of the ion beam source housing 44. The alignment fixture 90, with the clamping assembly 92 and extraction member 72 secured thereto (FIGS. 8A and 8B) is inserted through the source housing vertical side wall access opening 46c and the alignment fixture's mounting flange 98 is mounted to the source housing vertical face 48c. The alignment fixture 90 is dimensioned such that the arc slit 78 is accurately positioned and axially aligned with the predetermined beam path when the mounting flange 98 fits tight against the source housing vertical face 48c and a front face 99 of the mounting flange 98 abuts two positioning buttons 102 (FIGS. 2 and 9) extending from the interface plate 56. The alignment fixture 90 is secured to the source housing 44 with two screws 104a, 104b (the screw 104a being a socket head cap screw, the other screw 104b being an aligning shoulder screw) which extend through slots 105 in the mounting flange 98 screw into threaded apertures 106 in the source housing vertical face 48c.

The clamping assembly 92 is self-centering and secures the extraction member 72 to the ion source assembly support tube 80 while maintaining the position of the extraction member arc slit 78 with respect to the source housing 44 and, thereby, the predetermined beam path. Turning to FIGS. 6A and 6B, in addition to the support ring 94, the clamping assembly 92 also includes the outwardly opening split ring clamp 107 and the retainer ring 108. The split ring clamp 107 includes an annular groove 109 (FIG. 8A) on its back side which is dimensioned to freely slip over the annular stepped portion 82 of the ion source assembly support tube 80. Three shoulder screws 110 are tightened to secure the retainer ring 108 to the split ring clamp 107 but permit the support ring 94 to move freely between the split ring clamp 107 and retainer ring 108. The remaining six retaining screws 111 remain loose until the clamping assembly is secured to the support tube 80, as will be explained. The support ring 94 includes two inwardly extending tabs 114. The tabs 114 include four threaded apertures 116 and two extraction member positioning pins 118.

The two precision slots 75 of the extraction member 72 interfit with the tab extraction member positioning pins 118 to precisely position the extraction member with respect to the support ring 94. The extraction member 72 is then secured to the support ring tabs 114 by four shoulder screws 120 which screw into the threaded tab apertures 116. The shoulder screws 120 are loosely tightened to permit limited axial movement of the extraction member 74 (approximately 1/32") when mounted on the support tube 80 to allow for heat expansion when the ion implantation apparatus 10 is in operation. The supporting tabs 114 also include two locating holes 121.

Turning to FIGS. 7A, 7B, 8A and 8B, the clamping assembly 92, with the extraction member 72 secured to the support ring tabs 114, is attached to the front mounting surface 96 of the alignment fixture 90 by aligning the two alignment fixture locating pins 122 protruding from the front mounting surface 96 with the two locating holes 121 on support ring tabs 114. The alignment fixture locating pins 122 and tab locating holes 121 assure precise positioning of the extraction member 72 and thereby the arc slit 78 on the alignment fixture 90. Four grip latches 124 (FIGS. 4 and 7B) extend through the alignment fixture 90 and includes holders 126. The grip latches are tightened such that the holders 126 secure the extraction member 72 and the clamping assembly 92 to the alignment fixture mounting surface 96. The holders 126 are rotatable so that the alignment fixture 90 can be removed from the extraction member 72 and clamping assembly 92 after the clamping assembly 92 has been secured to the support tube 80.

As can best be seen in FIG. 4, the alignment fixture 90, with the clamping assembly 92 attached thereto, is inserted into the ion beam source housing 44 through the access opening 46c. As the alignment fixture 90 is inserted through the access opening 46c, the annular groove 109 of the split ring clamp 107 is slipped over the end of the ion source assembly support tube 80. The source housing mounting flange 98 of the alignment fixture 90 is positioned to rest flat on the source housing vertical side wall 48c and the front face 99 of the mounting flange 98 abuts the interface plate locating buttons 102. This assures precise positioning of the alignment fixture 90 and thereby the extraction member 70 and arc slit 78 with respect to the source housing 44 and the predetermined beam path. Alignment fixture screws 104a, 104b are inserted through slots 105 of the mounting flange 98 and screwed into source housing threaded apertures 106 to align and secure the alignment fixture 90 to the source housing 44.

The clamping assembly 92 is lightly tapped to permit the split ring clamp 107 to self center with respect to the support tube 80. Tightening a socket head cap screw 128 spreads the split ring clamp annular groove 109 open to secure the clamping assembly 92 to the annular stepped portion 82 of the support tube 80. Five of the six loose retainer ring screws 111 (FIGS. 6A and 8B), which are accessible with the alignment fixture 90 still in place, are then tightened to secure the support ring 94 and extraction member 72 in place, that is, secured to the support tube but maintaining the axial alignment of the arc slit 78 with the predetermined beam path. The grip latches 124 and alignment fixture bolts 104 are loosened and the alignment fixture 90 is removed through the access opening 46c. The remaining loose retainer ring screw 111 is then tightened. When extraction member 72 is secured to the tube support 80, the open side 62 of the arc chamber 18 bears against and sealingly engages the flat side 73 of the extraction member 72.

Since the extraction member 72 is precisely located on the alignment fixture from mounting surface 96, it is aligned with the predetermined beam path when the alignment fixture mounting flange 98 is secured to the source housing side wall 48c. Further, since the support ring 94 is initially laterally moveable with respect to the split ring clamp 107 and coupled retainer ring 108 prior to tightening retainer ring screws 111 permits the extraction member 72 to be held in position on the alignment fixture with the split ring clamp 107 being secured to the support tube 80 even if the support tube 80 is not perfectly centered about the predetermined beam line. After the split ring clamp 107 is secured to the support tube, tightening the retainer ring screws 111 tightly secures the support ring 94 between the split ring clamp 107 and the retainer ring 108. This secures the extraction member 72 in place and retains the proper alignment with the predetermined beam path resulting from use of the alignment fixture 90. The alignment fixture 90 can then be removed and the extraction member arc slit 78 will remain in alignment.

Turning to FIGS. 3, 9, 10A, 10B and 10C, the extraction electrode 20 is part of a variable gap electrode assembly 130. The variable gap electrode assembly 130 includes the extraction electrode 20, two graphite support legs 132, 133, two support leg tracks 168, 170, two aluminum electrode support plates 134, 135, an annular field ring 150 comprising two half rings 150a, 150b, a mounting plate 136 and an electrode assembly chamber 137.

After the alignment fixture 90 is removed from the ion beam source housing 44, the variable gap electrode assembly 130 is mounted to the ion beam source housing 44. The variable gap electrode assembly mounting plate 136 fits tight against the source housing vertical side wall 48c and abuts the two locating buttons 102 on the interface plate 56 and is secured to the source housing 44 by bolts 184, 185 (seen in FIG. 9). When the variable gap electrode assembly 130 is mounted to the source housing 44, the extraction electrode 20, the electrode support plates 134, 135, the annular field ring 150 and portions of the support legs 132, 133 extend into the source housing interior cavity 45.

Figure 10B:
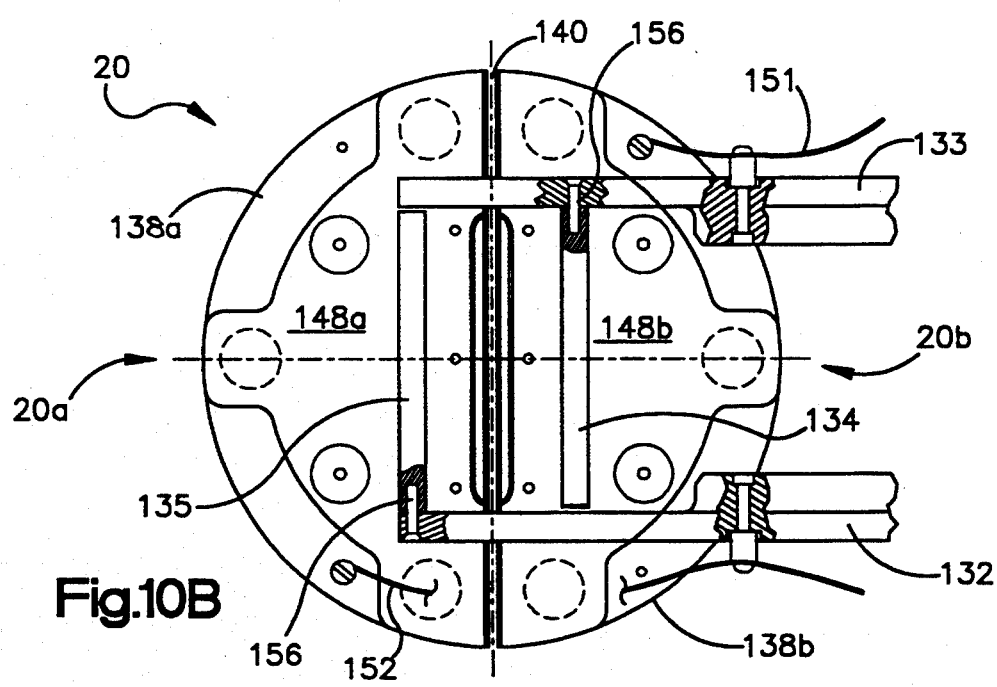
FIG. 10B is a rear elevational view of the variable gap electrode plate assembly of FIG. 10A.
Figure 10A:
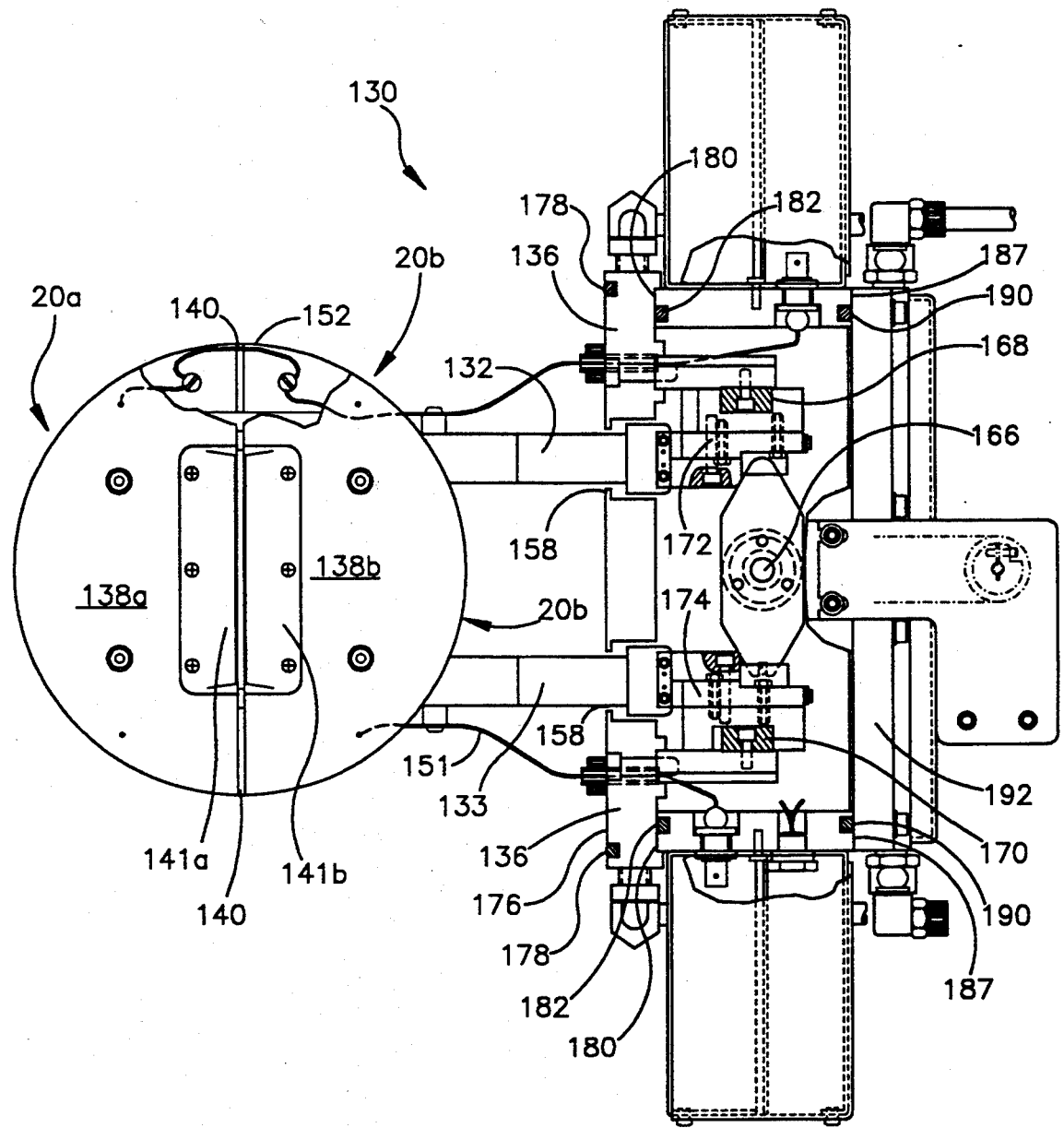
FIG. 10A is a front elevational view of the variable gap electrode plate assembly.
Figure 10C:
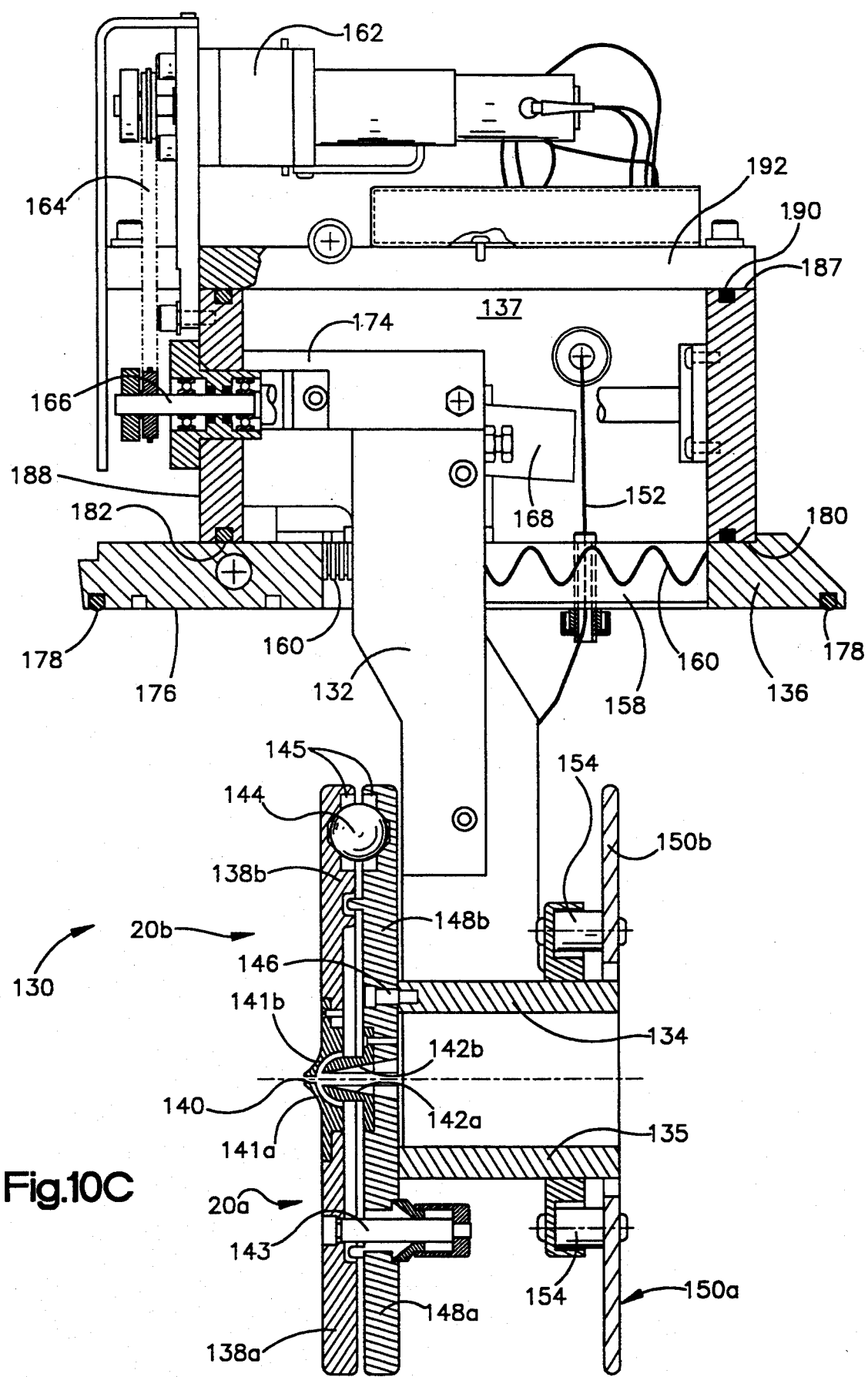
FIG. 10C is a sectional view of the variable gap electrode plate assembly.

Turning to FIGS. 10A, 10B and 10C, the extraction electrode 20 is comprised of the two matching graphite disk half assemblies 20a, 20a. When assembled, the disk half assemblies 20a, 20a are aligned in a common vertical plane which is perpendicular to the predetermined beam path and are spaced apart to define an elongated gap 140 which the ions exiting from the arc slit 78 pass through. The extraction electrode gap 140 must be precisely aligned with the predetermined ion beam path and the extraction member arc slit 78. Locating the extraction electrode 20 with respect to the same vertical side wall 48c and locating buttons 102 assures precise alignment of the extraction electrode gap 140 with the extraction member arc slit 78 since the extraction member arc slit 78 was also located from the same reference surface and used the same positioning buttons when positioned using alignment fixture 90.

Each of the disk half assemblies 20a, 20a is comprised of a extraction electrode plate disk half 138a, 138b, a ground plate disk half 148a, 148b, three ceramic insulating balls 144, two spring-loaded insulated shoulder screws 143, a extraction electrode plate replaceable edge insert piece 141a, 141b, and a back ground plate disk half replaceable edge insert piece 142a, 142b. The replaceable insert pieces 141a, 141b, 142a, 142b are secured to their respective disk halves 138a, 138b, 148a, 148b and define the extraction electrode gap 140. The insert pieces function to protect their associated disk halves from damage caused by the collision of the accelerating ions with the disk halves and can be replaced as required and will realign when reassembled.

The extraction electrode plate disk half 138a is secured in a spaced apart relationship to the back plate disk half 148a using the pair of spring-loaded shoulder screws 143 extending through the disk halves in conjunction with the three ceramic balls 144 which fit into cavities 145 near the outer periphery of the disk halves to provide the spaced apart, parallel relationship best seen in FIG. 10C. Similarly, the extraction electrode plate disk half 138b is secured in a parallel, spaced apart relationship to the ground plate disk half 148b.

The support legs 132, 133 extend through slotted openings 158 in the mounting plate 136. As can best be seen in FIG. 10C, extending across each opening 158 and secured to the support legs 132, 133 and the mounting plate 36 is a flexible ribbon bellows 160. The bellows 160 prevents contaminants generated in the ionization process from entering the electrode assembly chamber 137.

The electrode assembly chamber 137 encloses an end 172, 174 of each support leg 132, 133, respectively, and the support leg tracks 168, 170. A chamber side wall 188 supports a motor 162 and a belt 164. A bearing supported gear drive mechanism 166 extends through the chamber wall. The respective end 172, 174 of each support leg 132, 133 is slideably attached to a support leg tracks 168, 170, respectively. The tracks 168, 170 are inclined with the inclinations being in opposite directions.

Activating the motor 162 drives the belt 164 and the gear drive mechanism 166. The drive mechanism 166 is mechanically coupled to both of the support legs 132, 133 and moves the legs in unison along their respective tracks 168, 170. Since the tracks 168, 170 are inclined in opposite directions, movement of the support legs 132, 133 causes the extraction electrode gap 140 to vary in width. In the preferred embodiment, the path of travel of the support legs 132, 133 along their respective tracks 168, 170 is approximately 2½ inches. The tracks are inclined at oppositely sloped angles of 3½ degrees from the predetermined beam line. The path of travel and the angle of incline result in a extraction electrode gap width of 0.093 inches when the support legs 132, 133 are at an end of their path of travel closest to the extraction member 72 and a gap width of 0.400 at an end of their path of travel furthest from the extraction member 72.

Assembly of the variable gap electrode assembly 130 takes place in the following sequence. The variable gap electrode assembly 130 is partially assembled to a point where the support legs 132 and 133, which extend through mounting plate openings 158 and the support leg tracks 168, 170 are secured within the electrode assembly chamber 137. Next, one electrode support plate 35 is fastened to one support leg 132 and the other electrode support plate 134 is fastened to support leg 133 using screws 156 (FIG. 10B).

This partial assembly is then positioned in a fixture (not shown) which duplicates the mounting position of the variable gap electrode assembly 130 on the source housing 44. Weights (not shown) that simulate the weight of the disk half assemblies 20a, 20a and the field ring half rings 150a, 150b and supporting hardware are attached to the respective support legs 132, 133. The weights cause the support legs to deflect to the same extent as they will when the ion implantation apparatus 10 is in operation. The support legs 132, 133 are then moved all the way forward within their respective mounting plate slotted openings 158 and carefully clamped in the forward position. A mounting surface of each support plate 134, 135 that the extraction electrodes disk half assemblies 20a, 20a will be secured to are precision machined to create a flat vertical mounting surface. Using a drill fixture (not shown), two mounting holes are drilled into the mounting surface of each support plate 134, 135, the holes are then tapped.

The partial assembly is then removed from the machining fixture and the extraction electrode disk half assemblies 20a, 20a and field rings half rings 150a, 150b are mounted on the electrode support plates 134 and 135. The disk half assembly 20b is secured to the electrode support plate 134 by two precision alignment screws 146 (only one of which can be seen in FIG. 10C) which extend through the ground plate disk half 148b and screw into the threaded mounting holes in the mounting surface of the support plate 134. Similarly, the disk half assembly 20a is secured to the electrode support plate 135 by two precision alignment screws (not shown).

At an end of the electrode support plates 134, 135 away from the disk halves, a annular field ring 150 is secured to the support plates. The field ring 150 is comprised of two half rings 150a, 150b which are electrically energized by a conductor 152 (seen in FIG. 10A) which also energizes the front extraction electrode plate disk half 138a. Thus, the electrical potential of the field ring 150 is equivalent to one half the potential of the electrode plates 20. The other front extraction electrode plate disk half 138b is selectively energized by a conductor 151 to provide a greater variety of electrical field strengths thus enabling better control over the ion implantation process. The field ring 150 is electrically insulated from the support plates 134, 135 by ceramic insulators 154.

When the variable gap electrode assembly 130 is mounted on the source housing vertical side wall 48c, the weight of the extraction electrode disk half assemblies 20a, 20b and field ring half rings 150a, 150b, deflect the support legs 132 and 133 to the same extent as had been simulated in the machining fixture when the electrode support plates 134, 135 mounting surfaces were machined, drilled and tapped. Mounting the support plate 136 against the positioning buttons 102 and simulating support leg deflection when machining the support plates 134, 135 as described above results in the extraction electrode gap 140 being axially aligned with the predetermined beam path and the arc slit 78.

Figure 9:
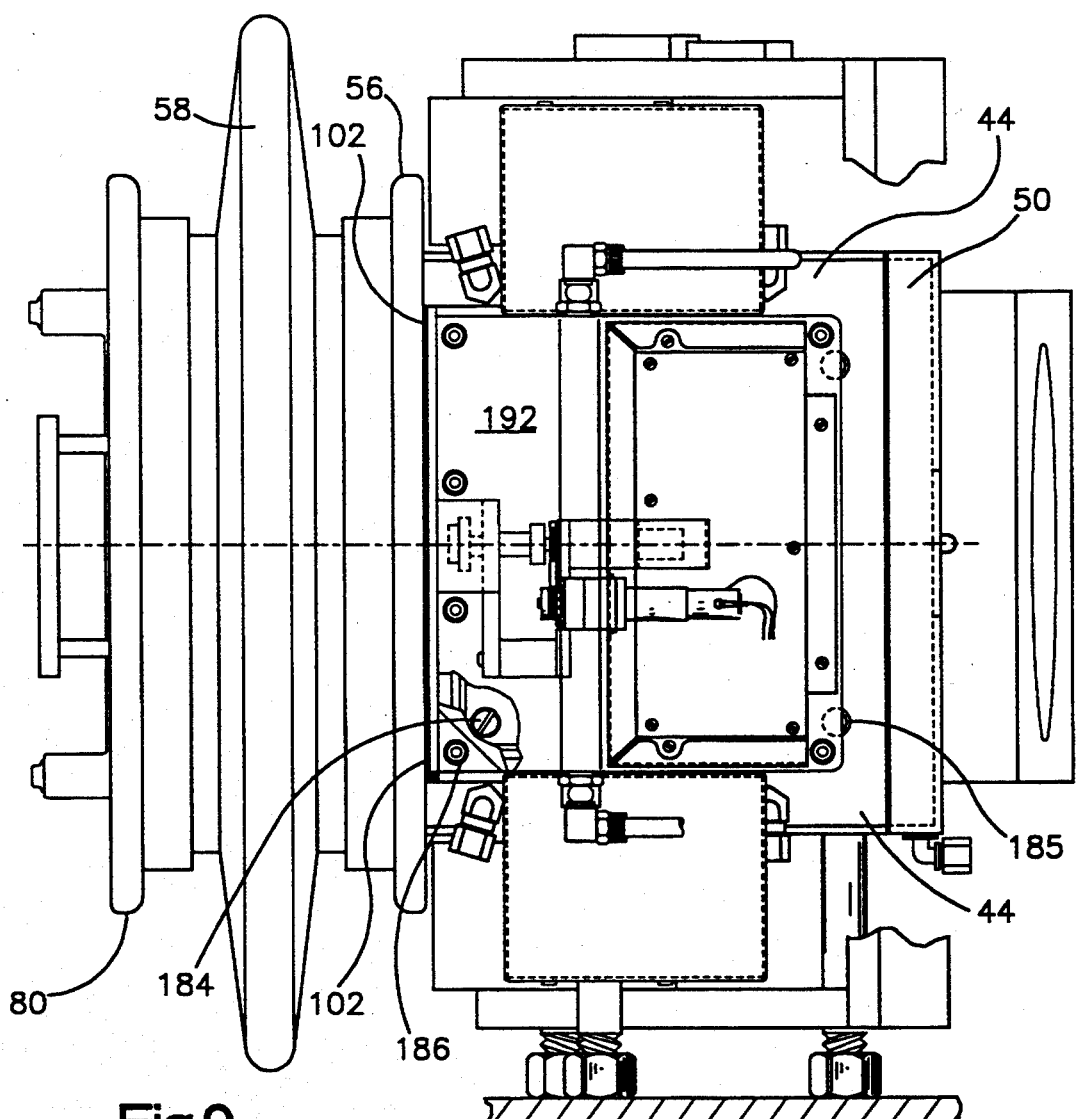
FIG. 9 is an elevational view of the ion beam source assembly with a variable gap electrode assembly mounted to the source assembly housing.

The mounting plate 136 is secured to the source housing 44 by bolts 184, 185. A bottom surface 176 of the mounting plate 136 includes a groove with an O-ring 178 near its outer periphery to insure a positive seal with the source housing vertical side wall 48c. A bottom surface 180 of the electrode assembly chamber 137 also has a groove and O-ring combination 182 to seal against the mounting plate 136. The chamber 137 is secured to the mounting plate 136 by bolts 186, one of which is shown in FIG. 9. An upper surface 187 of a side wall 188 of the chamber 137 also includes a groove and O-ring combination 190 which seals against the chamber cover 192. This permits the chamber to be evacuated and thereby be at the same vacuum pressure as the ion beam source housing interior cavity 45.

While the present invention has been described in some degree of particularity, it is to be understood that those of ordinary skill in the art may make certain additions or modifications to, or deletions from, the described present embodiment of the invention without departing from the spirit or scope of the invention, as set forth in the appended claims.

I claim:

1. An ion implantation apparatus for generating and accelerating ions along a predetermined beam path to treat a workpiece, the apparatus comprising:

a) an ion beam source assembly including an ion beam source housing defining an interior region and having at least one side wall having an access opening in communication with the interior region, an ion source assembly extending into the source housing interior region and including an arc chamber having an open side and defining a chamber interior into which an ionizable gas is routed, an ion source assembly support tube surrounding at least a portion of the ion source assembly including the arc chamber, an extraction member including an elongated aperture, a biasing means for biasing the open side of the arc chamber against the extraction member to sealing engage the extraction member and an energy source for ionizing the gas in the chamber interior thereby generating ions which exit the arc chamber interior through the elongated aperture of said extraction member; and b) a clamping assembly comprising a support ring movably secured between a retainer ring and a circumferentially adjustable split ring, the support ring including a mounting means for securing the extraction member thereto, the split ring including an annular groove in a side wall, the groove being dimensioned to slip onto one end of an ion source assembly support tube surrounding the arc chamber and engage the support tube when the split ring circumference is adjusted thereby securing the extraction member to the ion source assembly support tube.

2. The ion implantation apparatus of claim 1 including an alignment fixture including a clamping support member and an integral mounting member, the clamping support member having a mounting surface and a securing means for removably securing the clamping assembly and the extraction member secured thereto to the mounting surface and sized to fit through the source housing access opening, the mounting member adapted to be removably secured to the source housing adjacent the access opening, the alignment fixture being dimensioned such that, when the mounting member is secured to the source housing, the extraction member aperture is axially aligned with the predetermined beam path.

3. The ion implantation apparatus of claim 1 wherein the ion beam source assembly further includes a variable gap electrode assembly comprising an extraction electrode including two matching disk half assemblies which are secured in a spaced apart relationship defining an extraction electrode gap, two support legs, two support leg tracks and a driving mechanism, each disk half assembly being secured to a respective support leg near one end of the leg, an opposite end of each of the support legs engaging a respective support leg track, each of the support legs having a path of travel along its support leg track, the driving mechanism coupled to each support leg and selectively operable to move the support legs along their respective paths of travel, the support leg tracks being sloped in opposite directions such that a width of the extraction electrode gap varies as the leg supports move along their respective paths of travel.

4. The ion implantation apparatus of claim 1 wherein the variable gap electrode assembly further includes a housing chamber having a mounting plate securable to the ion beam source housing sealingly overlying the access opening, the leg support tracks and portions of the leg supports engaging the leg support tracks disposed within the chamber, the mounting plate including two spaced apart slotted openings through which the leg support portions supporting the disk half assemblies extend into the source housing interior region, the slotted openings being sized to permit movement of the leg supports along their respective paths of travel.

5. The ion implantation apparatus of claim 1 wherein the extraction member includes a flat wall portion on one side of the member and wherein the open-side of the arc chamber includes a wall engaging peripheral surface to sealingly engage the extraction member flat wall portion and further wherein the biasing means includes a set of spring engaging and urging the arc chamber against the extraction member.

6. The ion implantation apparatus of claim 1 wherein the extraction member aperture is an elliptical slit.

7. The ion implantation apparatus of claim 1 wherein the clamping assembly support ring includes at least two tabs extending therefrom, the tabs providing a support for mounting the extraction member, at least two tab portions including one or more locating projections which interfit with corresponding locating apertures or slots in the extraction member to precisely locate the extraction member aperture with respect to the clamping assembly support ring.

8. The ion implantation apparatus of claim 7 wherein the alignment fixture mounting surface includes at least two locating projections which interfit with locating apertures or slots in the clamping assembly support ring to precisely locate the extraction member aperture with respect to the alignment fixture.

9. The ion implantation apparatus of claim 7 wherein one or more of the locating apertures or slots in the clamping assembly support ring are located in one or more of the tabs.

10. A method for positioning an ion source assembly extraction member within an interior region of an ion beam source assembly housing having at least one access opening in a side wall and an ion source assembly support tube extending into the source assembly housing interior region so that an aperture of the extraction member is axially aligned with a predetermined ion beam path, the method comprising the steps of:
  a) affixing the extraction member to a support ring of a self-centering clamping assembly having a circumferentially adjustable split ring for engaging the support tube;
  b) mounting the extraction member, with the clamping assembly affixed thereto, to a mounting surface of an alignment fixture;
  c) inserting a portion of the alignment fixture, including the mounting surface, through the side wall access opening of the ion beam source assembly housing so that the split ring is adjacent an end of the support tube;
  d) mounting the alignment fixture to the ion beam source assembly housing, the alignment fixture being dimensioned so that the extraction member is axially aligned with the predetermined beam line;
  e) adjusting the split ring to secure the clamping assembly to the support tube;
  f) separating the alignment fixture from the extraction member; and
  g) removing the alignment fixture from the source housing.

11. The method for positioning an ion source assembly extraction member of claim 10 further including the step of:
  h) positioning an ionization arc chamber having one open side within the support tube so that its open side sealingly engages the extraction member.

12. A method for assembling an extraction electrode assembly including two spaced apart disk half assemblies, two support plates, two support legs and an ion source assembly mounting plate so that a gap defined by the disk half assemblies is axially aligned with a predetermined ion beam path when the mounting plate is secured to an ion beam source assembly housing, the disk half assemblies being secured to respective support plates, the support plates being secured to respective support legs and the support legs extending through slots in and supported by the mounting plate, the steps of the method comprising:
  a) assembling the mounting plate, support legs and the support plates forming a partially assembled extraction electrode assembly;
  b) supporting the partially assembled extraction electrode assembly in a machining fixture;
  c) adding weights to the support legs to simulate the deflection of the legs of a fully assembled extraction electrode assembly mounted to the ion beam source assembly housing;
  d) precision machining a disk half assembly mounting surface of each support plate such that the disk half assembly gap is axially aligned with the predetermined beam path when the fully assembled extraction electrode assembly is mounted to the ion beam source assembly housing;
  e) removing the weights from the support legs;
  f) mounting the disk half assemblies to the disk half assembly mounting surfaces of their respective support plates; and
  g) securing the ion source assembly housing mounting plate to the source assembly housing.

13. An ion source assembly for an ion implantation system, the source assembly comprising:
  a) an ion beam source housing defining an interior region and an access opening;
  b) a support tube supported by the source housing and extending into the interior region;
  c) an ion arc chamber having an open side and defining a cavity into which ionizable source materials are routed, the arc chamber at least partially surrounded by and supported within the support tube; and
  d) an extraction member sealingly engaging the arc chamber's open side, the extraction member including an arc slit through which ions generated in the arc chamber cavity exit the arc chamber; and
  e) arc slit locating structure having:
    i) a clamping member which engages the support tube to support the extraction member; and
    ii) locating means for aligning said arc slit with a predetermined beam line, the locating means adapted to be precisely positioned with respect to the source assembly housing and being moveable with respect to the clamping member prior to securing the clamping member to the support tube end in directions transverse to the predetermined ion beam path.

14. The ion source assembly of claim 13 wherein the locating means includes locating posts which interfit with locating slots in the extraction member to axially align the extraction member arc slit with the predetermined ion beam path.

15. The ion source assembly of claim 14 wherein the locating means includes a support ring including two inwardly extending tab portions and the locating posts extend from said tab portions.

16. The ion source assembly of claim 13 wherein the clamping member includes a circumferentially adjustable split ring.

17. The ion source assembly of claim 15 wherein the extraction member is mounted to the support ring tab portions.

18. The ion source assembly of claim 16 wherein the clamping member further includes a retainer ring coupled to a face of the split ring opposite the support tube.

* * * * *